United States Patent
Shih et al.

(10) Patent No.: US 9,530,663 B1
(45) Date of Patent: Dec. 27, 2016

(54) METHOD FOR FORMING A PATTERN

(71) Applicant: NANYA TECHNOLOGY CORP., Taoyuan (TW)

(72) Inventors: Chiang-Lin Shih, New Taipei (TW); Shu-Hao Hsu, Yunlin County (TW); Ya-Chih Wang, New Taipei (TW)

(73) Assignee: NANYA TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 14/746,849

(22) Filed: Jun. 23, 2015

(51) Int. Cl.
*H01L 21/308* (2006.01)
*H01L 21/027* (2006.01)
*B05D 1/32* (2006.01)

(52) U.S. Cl.
CPC .......... *H01L 21/3086* (2013.01); *B05D 1/322* (2013.01); *H01L 21/0271* (2013.01); *H01L 21/3088* (2013.01)

(58) Field of Classification Search
CPC ............. H01L 21/0271; H01L 21/3086; H01L 21/3088; B05D 1/322
See application file for complete search history.

(56) References Cited

U.S. PATENT DOCUMENTS

| | | | |
|---|---|---|---|
| 2011/0052883 A1* | 3/2011 | Jain | G03F 7/2022 428/195.1 |
| 2013/0344249 A1* | 12/2013 | Minegishi | C08L 33/14 427/271 |
| 2014/0322915 A1* | 10/2014 | Lee | H01L 21/0337 438/701 |
| 2014/0342290 A1* | 11/2014 | Wu | G03F 7/0035 430/285.1 |
| 2014/0357083 A1* | 12/2014 | Ling | H01L 21/31138 438/694 |
| 2015/0048049 A1* | 2/2015 | Nishimura | B82Y 30/00 216/37 |
| 2015/0151329 A1* | 6/2015 | Kawanishi | G03F 7/0002 427/553 |
| 2015/0301445 A1* | 10/2015 | Komatsu | C09D 125/14 216/49 |
| 2016/0027659 A1* | 1/2016 | Hong | H01L 21/31144 257/774 |
| 2016/0042971 A1* | 2/2016 | Mohanty | H01L 21/31138 438/705 |
| 2016/0049307 A1* | 2/2016 | Chen | H01L 21/31111 438/696 |

(Continued)

FOREIGN PATENT DOCUMENTS

TW 200939297 9/2009
TW 201407265 A 2/2014

*Primary Examiner* — Joseph C Nicely
(74) *Attorney, Agent, or Firm* — Winston Hsu; Scott Margo

(57) ABSTRACT

A method for forming a pattern includes steps of forming a patterned core layer on a substrate, conformally forming a spacer layer on the patterned core layer to form first concave portions, performing an etch back process to expose the patterned core layer, removing the exposed patterned core layer to form second concave portions, filling up the first concave portions and the second concave portions with a directed self-assembly material, and activating a directed self-assembly process, so that the directed self-assembly material is diffused to the perimeter of the concave portions to form a hole surrounding by the directed self-assembly material in each concave portions.

11 Claims, 7 Drawing Sheets

(56) References Cited

U.S. PATENT DOCUMENTS

| | | | |
|---|---|---|---|
| 2016/0093718 A1* | 3/2016 | Han | H01L 29/66492 257/288 |
| 2016/0099178 A1* | 4/2016 | Zhang | H01L 21/823431 438/478 |
| 2016/0104628 A1* | 4/2016 | Metz | H01L 21/3086 438/703 |

* cited by examiner

METHOD FOR FORMING A PATTERN

BACKGROUND OF THE INVENTION

1. Field of the Invention

The present disclosure relates to a method for forming a pattern of a hole or trench on a substrate, and more specifically, to a method for forming a hole or trench by using double patterning technology with directed self-assembly (DSA) material.

2. Description of the Prior Art

As semiconductor devices become smaller and highly integrated, the whole chip area is increased in proportion to an increase in memory capacity. However, an area of a cell region in the semiconductor device, which contains patterns, is practically decreased. A pitch size of patterns, for example a critical dimension (CD) of a pattern or distance between two adjacent patterns, becomes reduced. With high integration of semiconductor devices, a technology for processing semiconductor devices in a finer manner has been needed. As a technology for providing fine patterns for semiconductor devices, a method of forming a resist pattern using a photolithographic process and etching a base film using the resist pattern as a mask has been commonly used.

As a design rule of semiconductor devices is decreased, the pitch size of patterns which is realized in the semiconductor devices becomes reduced. Making semiconductor devices fine beyond the resolution limit of a photolithographic process has been desired. However, since the maximum resolution of a photolithography apparatus is preset, it is difficult to form patterns that are finer than the maximum resolution of the apparatus. For example, it has been said that the resolution of ArF (193 nm) immersion exposure, which has been widely used in exposure technology, may reach a limit of 4× nm generations.

In order to further proceed to a finer 3X nm generation, a double patterning technology such as a lithography etching lithography etching (LELE) process or the like has been actively developed. For example, a process is known in which a first resist opening pattern of a first resist film is formed and a first hole or trench pattern is formed on a base film using the formed first resist opening pattern, and, subsequently, a second resist opening pattern of a second resist film is formed and a second hole or trench pattern is formed on the base film using the formed second resist opening pattern.

In the development of various double patterning technology, US patent application publication, US 2011/0124196, provides a novel method exclusively for forming contact hole array pattern with fine pitch smaller than 40 nm. This method uses the double patterning scheme of uniformly-disposed pillar cores and an atomic deposition layer (ALD) layer conformally-deposited on the pillar cores to define the whole contact holes array with desired pitch. However, the utmost issue of this double patterning scheme is that the defined hole patterns will have two different shapes. This inbuilt feature would significantly impact CD uniformity of the hole pattern.

Accordingly, there is a demand for a method for forming a contact hole pattern array with better CD uniformity.

SUMMARY OF THE INVENTION

In order to obtain a pattern with better CD uniformity and smaller feature size in the sub-40 nm half-pitch scale, the present invention has been made in an effort to improve the conventional double patterning technology by utilizing directed self-assembly (DSA) material. Preferred aspects of the invention enable the creation of contact or vias with adequate CD uniformity at tight pitch (e.g., sub-22 nm node). Methods are disclosed in which directed self-assembly materials are applied to a substrate to define the target pattern. The defined target pattern can be uniformly-formed in pre-defined space in double patterning process based on the mechanism of directed self-assembly. The target pattern can be transferred to an underlying substrate or hard mask.

One objective of the present invention is to provide a method for forming a pattern, which comprises the steps of: forming a core layer on a substrate and patterning the formed core layer into a patterned core layer, conformally forming a spacer layer on the patterned core layer and the substrate to form a plurality of first concave portions surrounded by the spacer layer, performing an etch back process to expose the patterned core layer and the substrate under the first concave portions, removing the exposed patterned core layer to form a plurality of second concave portions surrounded by the spacer layer, filling up the first concave portions and the second concave portions with a directed self-assembly material; and activating a directed self-assembly process so that the directed self-assembly material filling up the first concave portions and the second concave portions diffuse to the boundaries of the first concave portions and the second concave portions to form a hole surrounding by the directed self-assembly material in each of the first concave portions and the second concave portions.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1A:
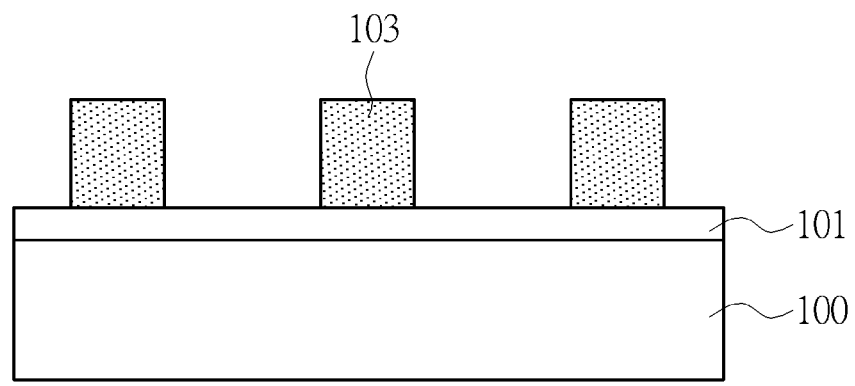
FIGS. 1A, 2A, 3A, 4A, 5A, 6A, 7 and 8 are cross-sectional views schematically depicting an exemplary process flow of forming an array of contact hole pattern in accordance with the embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown byway of illustration and specific embodiments in which the invention may be practiced. These embodiments are described in sufficient details to enable those skilled in the art to practice the invention.

Other embodiments may be utilized and structural, logical, and electrical changes may be made without departing from the scope of the present invention. The following detailed description, therefore, is not to be taken in a limiting sense, and the scope of the present invention is defined by the appended claims.

Before describing the preferred embodiment in more detail, further explanation shall be given regarding certain terms that may be used throughout the descriptions.

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete. The above description serves to distinguish the term "etching" from "removing." When etching a material, at least a portion of the material remains behind after the process is completed. In contrast, when removing a material, substantially all of the material is removed in the process. However, in some embodiments, 'removing' is considered to be a broad term that may incorporate etching.

During the descriptions herein, various regions of the substrate upon which the field-effect devices are fabricated are mentioned. It should be understood that these regions may exist anywhere on the substrate and furthermore that the regions may not be mutually exclusive. That is, in some embodiments, portions of one or more regions may overlap. Although up to three different regions are described herein, it should be understood that any number of regions may exist on the substrate and may designate areas having certain types of devices or materials. In general, the regions are used to conveniently describe areas of the substrate that include similar devices and should not limit the scope or spirit of the described embodiments.

The terms "forming," "form," "deposit," or "dispose" are used herein to describe the act of applying a layer of material to the substrate. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

The "substrate" as used throughout the descriptions is most commonly thought to be silicon. However, the substrate may also be any of a wide array of semiconductor materials such as germanium, gallium arsenide, indium phosphide, etc. In other embodiments, the substrate may be electrically non-conductive such as a glass or sapphire wafer.

FIGS. 1A, 2A, 3A, 4A, 5A, 6A, 7 and 8 are cross-sectional views schematically depicting an exemplary process flow of forming an array of contact hole pattern in accordance with the embodiment of the present invention, and FIGS. 1B, 2B, 3B, 4B, 5B and 6B are top views corresponding respectively to FIGS. 1A, 2A, 3A, 4A, 5A and 6A. The cross-sectional view is taken along with the line A-A' in its corresponding cross-sectional view. Please refer to the cross-sectional view and their respective top view at the same to have a better understanding for the exemplary process flow provided in the present invention.

Figure 1B:
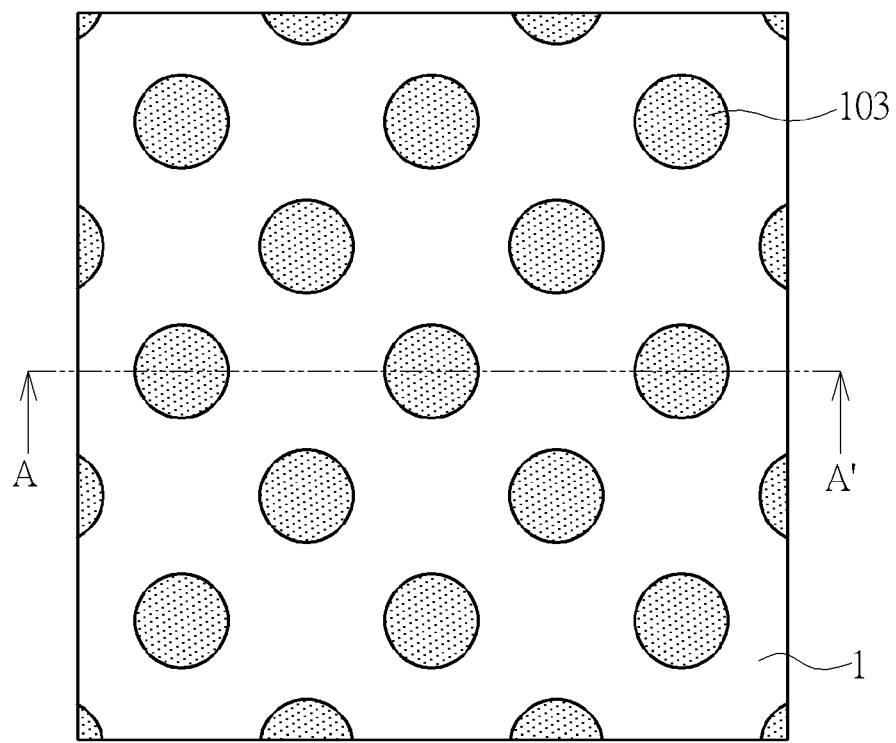
FIGS. 1B, 2B, 3B, 4B, 5B and 6B are top views corresponding respectively to FIGS. 1A, 2A, 3A, 4A, 5A and 6A of the exemplary process flow of forming an array of contact hole pattern in accordance with the embodiment of the present invention.

First, please refer to FIGS. 1A and 1B. In the embodiment, the desired target pattern, for example an array of contact hole pattern, is formed preliminarily on a substrate 100. The substrate 100 is first provided to serve as a base for forming those patterns in the structure. In the application for forming contact hole pattern, The substrate may be, but is not limited to, tetraethoxysilane (TEOS), spin-on-glass (SOG), SiON, a composite of low temperature oxide (LTO) and Si-contained BARC, etc. Alternatively, in the application for forming trench or STI structure, The substrate 100 is commonly p-type or a p-type well while the doped source/drain regions (not shown) are n-type. However, it is also possible for substrate 100 to be n-type while the source/drain regions are p-type. In the embodiment, the substrate 100 may include a silicon substrate, a silicon-containing substrate, a GaN-on-silicon (or other material of Group III-V), a grapheme-on-silicon substrate or a silicon-on-insulator (SOI) substrate and so on.

In the embodiment, the substrate 100 may be optionally provided with a hard mask (HM) layer 101 comprising any suitable material that allows for selective removal (e.g., etching) of the unmasked portion. In the embodiment with hard mask layer 101, the hard mask layer 101 will be patterned first in later processes to serve as the etching mask for forming the pattern features from the underlying substrate 100. The hard mask layer 101 may be a silicon nitride (SiN) layer, a silicon carbon nitride (SiCN) layer, or silicon oxide ($SiO_2$), but not limited thereto.

A core layer 103 is formed on the hard mask layer 101 and is then patterned into a predetermined pattern, such as a circular pillar in the exemplary embodiment. In double patterning scheme, the so-called core layer is to serve as an inner core for an outer spacer layer to be conformally deposited thereon in a later process. Specifically, the core layer 103, such as a photoresist (PR), is first formed on the hard mask layer 101 by spin-on coating. The material of the core layer 103 may be an ArF resist. Then, the formed core layer 103 is patterned by photolithographic process, for example, the coating and developing apparatus having an exposure device. The film thickness and patterning pitch in the formation of core layer 103 may be appropriately selected by those skilled in the art. In the exemplary embodiment which is designed for forming an array of hole pattern, the formed patterned core layer (core pillar) 103 is preferably an array of circular pillars evenly distributed on the hard mask layer 103 or the substrate 101. Each core pillar would have a predetermined spacing, for example half of the thickness of the spacer layer to be deposited thereon, in order to obtain desired target pattern pitch in the double patterning process scheme.

Figure 2A:
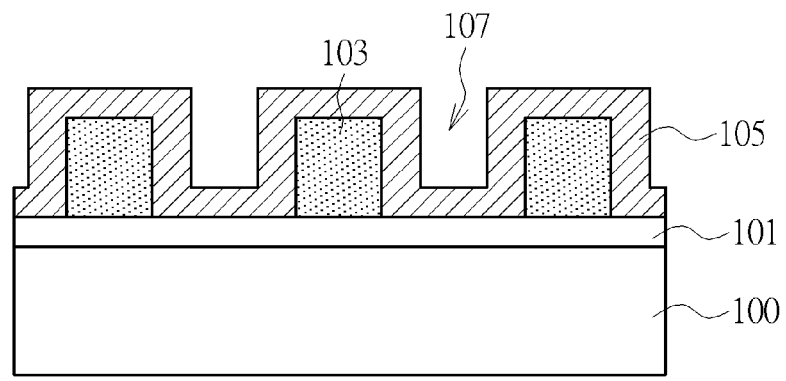
Figure 2B:
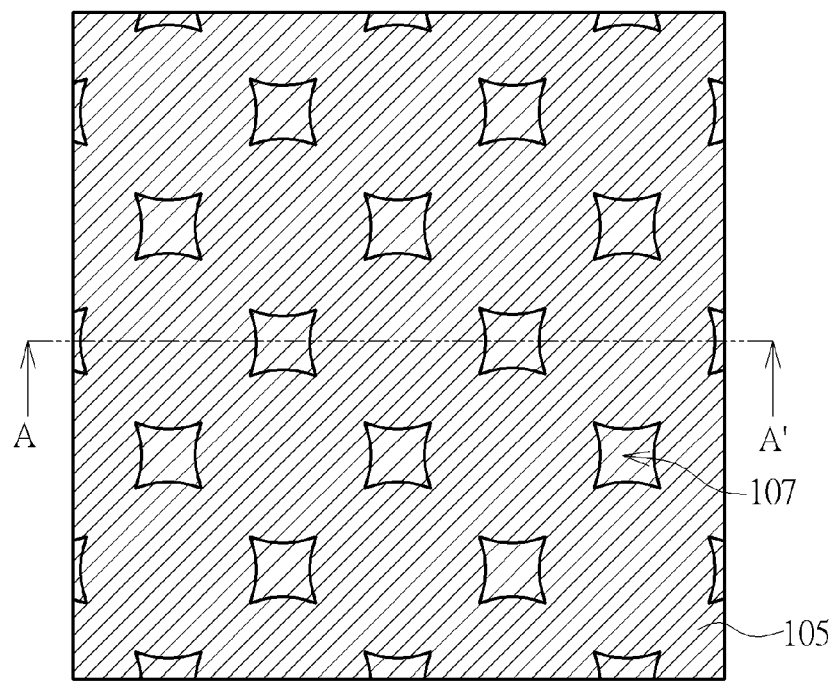

Please refer now to FIGS. 2A and 2B. After defining the pattern of core layer 103, next, a process of forming a spacer film to coat the hard mask layer 101 on which the core layer 103 is formed will be described. As shown in FIG. 2A, a spacer layer 105 is conformally formed on the patterned core layer (core pillars) 103 and the hard mask layer 101. The spacer layer 105 may be formed of silicon oxide ($SiO_2$), aluminum oxide ($Al_xO_y$), aluminum nitride (AlN), titanium oxide ($TiO_x$), silicon nitride (SiN), amorphous silicon, polysilicon and a combination thereof. According to the spacer layer forming process described above, the spacer layer 105 is formed to cover the core pillars 103 and the hard mask layer 101 with a thickness preferably smaller than half of the spacing between the core pillars 103. In other words, with appropriate thickness and array configuration, the formed spacer layer 105 is like a larger circular pillar having an inner core pillar 103, and a plurality of square-like concave portions 105 would be formed and evenly distributed and surrounded by the larger pillars made of the spacer layer 105 at the same time when the spacer layer 105 is formed. The size of the concave portion 107 may be appropriately selected by those skilled in the art since it is dependent on the patterning of the core layer 103 and the thickness of the spacer layer 105. It is preferable that the size and shape of the concave portion 107 is more similar to the ones of the core pillar 103 in order to obtain a better CD uniformity for the final target pattern. Please note that, since there will be another type of concave portion to be formed in a later process, the concave portion 107 will be referred hereinafter as first concave portion 107.

In the exemplary embodiment, it is clearly shown in FIG. 2B that the first concave portions 107 are evenly distributed in the array with the core pillars 103. The array arrangement of the first concave portions 107 with the core pillars 103 is also a critical feature in the exemplary embodiment, since both of the first concave portions 107 and the core pillars 103 would be transformed to the final target patterns. Detailed description will be explained in following paragraphs.

In the embodiment, the spacer film forming process is not particularly limited but may be preferably an atomic layer deposition (ALD). ALD refers to a method of forming a film having high step coverage through repetition of absorption of raw material compound molecules onto a surface of each monolayer on a substrate, a film formation by a reaction, and a reset of the system. ALD is advantageous in that it can provide a high precision of film thickness control, composition control and step coverage and further provide a wide range of choices of available materials. These properties are important in the process of double patterning scheme. In addition, it has another advantage in that it allows a film to be formed in a range of temperatures at which other manufacturing processes of semiconductor devices are performed, for example, a temperature range of 23° C. to 25° C.

Figure 3A:
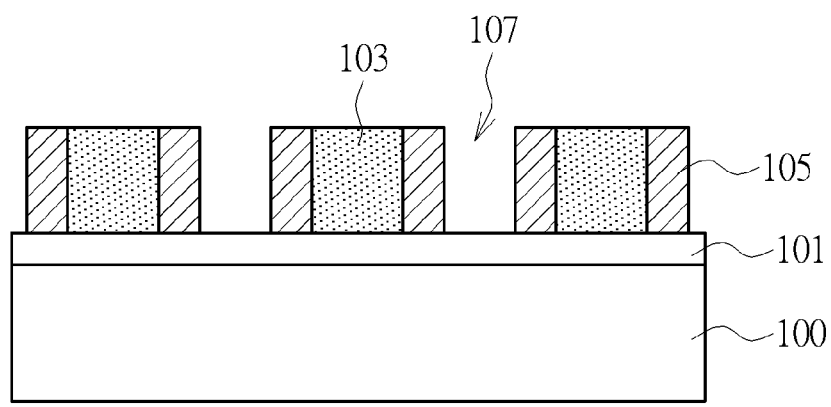
Figure 3B:
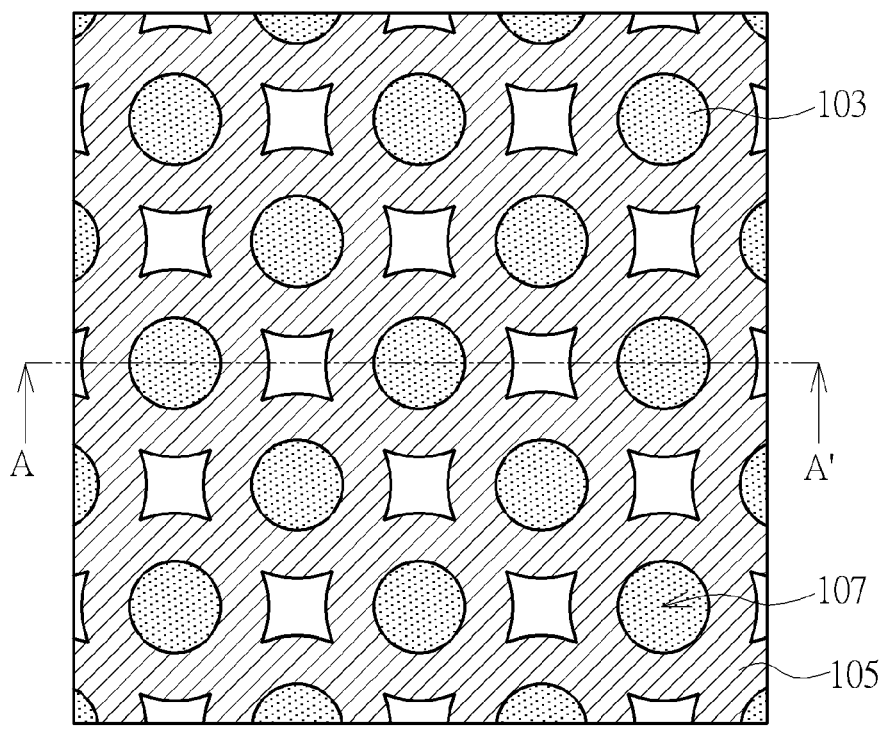

Next, please refer to FIGS. 3A and 3B, an etch back process, for example a reactive ion etching (RIE), is performed to anisotropically etch and remove the spacer layer 105 with a certain thickness. In the embodiment, the etch back process is performed until the core pillars 103 is exposed from the spacer layer 105. Please note that this etch process would also remove the spacer layer 105 right on the hard mask layer 101 and expose the hard mask layer 101 from the first concave portion 107. The remaining spacer layer 105 surrounds the sidewalls of the core pillars 103 and the first concave portion 107.

Figure 4A:
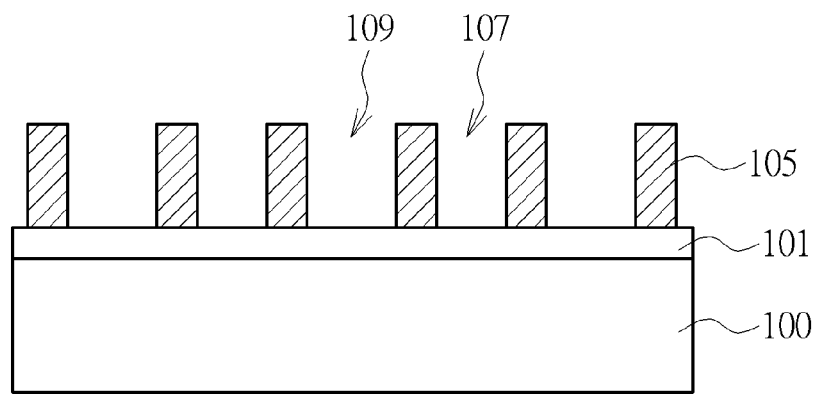
Figure 4B:
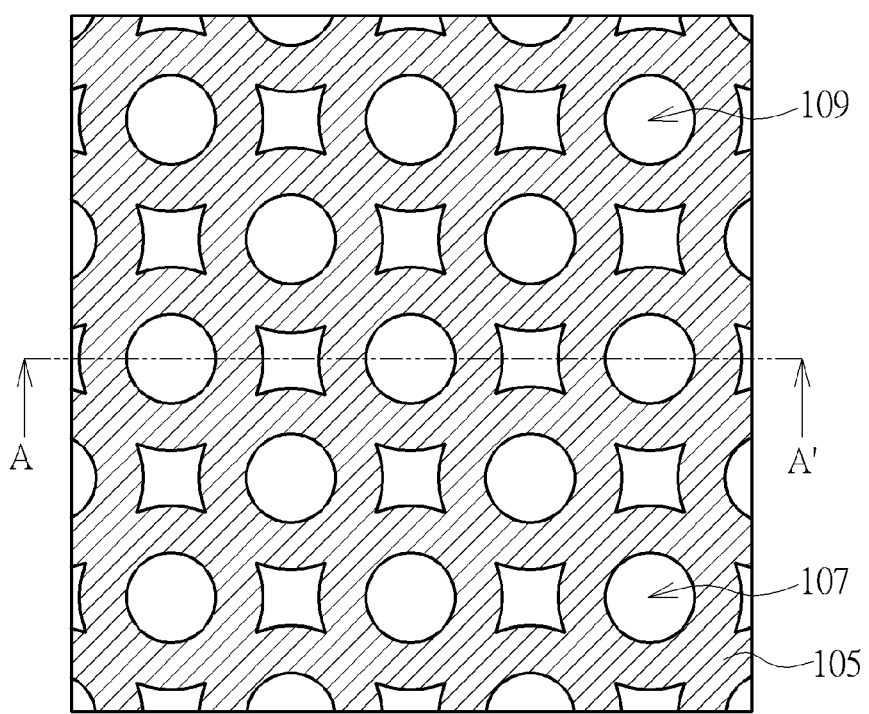

Next, please refer to FIGS. 4A and 4B, a process is performed to remove the core pillars 103 on the hard mask layer 101. In the embodiment, this process for removing the core pillars 103 may be, but is not limited to, an ashing or etching process. The etching rate of the core pillar 103 in the etch back process is preferably larger than the etchant rate of the spacer layer 105, thus the spacer layer 105 will only be slightly etched and maintain a high precision of original shape when the core pillars are removed.

After the core pillars 103 are removed, each space once occupied by the core pillar 103 forms a circular concave portion, which is referred hereinafter as a second concave portion 109. In the exemplary embodiment, it is clearly shown in FIG. 4B that the second concave portions 109 are evenly distributed on the hard mask layer 105 and surrounded by the spacer layer 105, and the first concave portions 107 and the second concave portions 109 have different shapes, where one is circular and the other is square-like. This shape difference of the concave portion is exactly the problem encountered in the conventional double patterning scheme.

In the exemplary embodiment, the first concave portions 107 and the second concave portions 109 have different shapes. This means the target pattern defined by the concave portions 107 and 109 would have two quite different statistical distributions of CDs (e.g., diameters in this example of cylindrical openings). However, in the present invention, the final desired patterns of contact or via hole is not defined by the first concave portions 107 and the second concave portions 109. The hole patterns will be defined by using the property of directed self-assembly to obtain the hole with uniform shape and CDs.

Figure 5A:
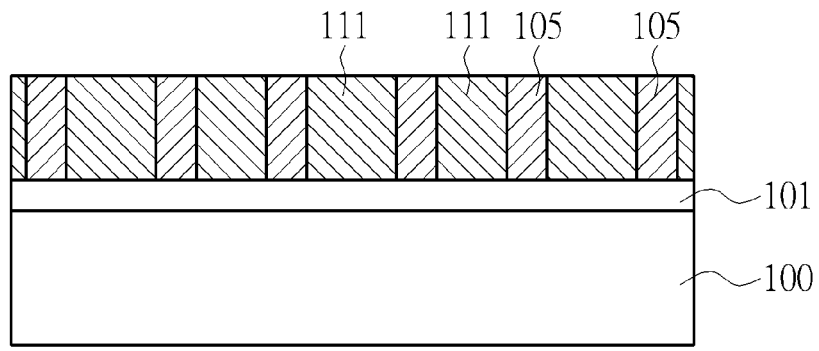
Figure 5B:
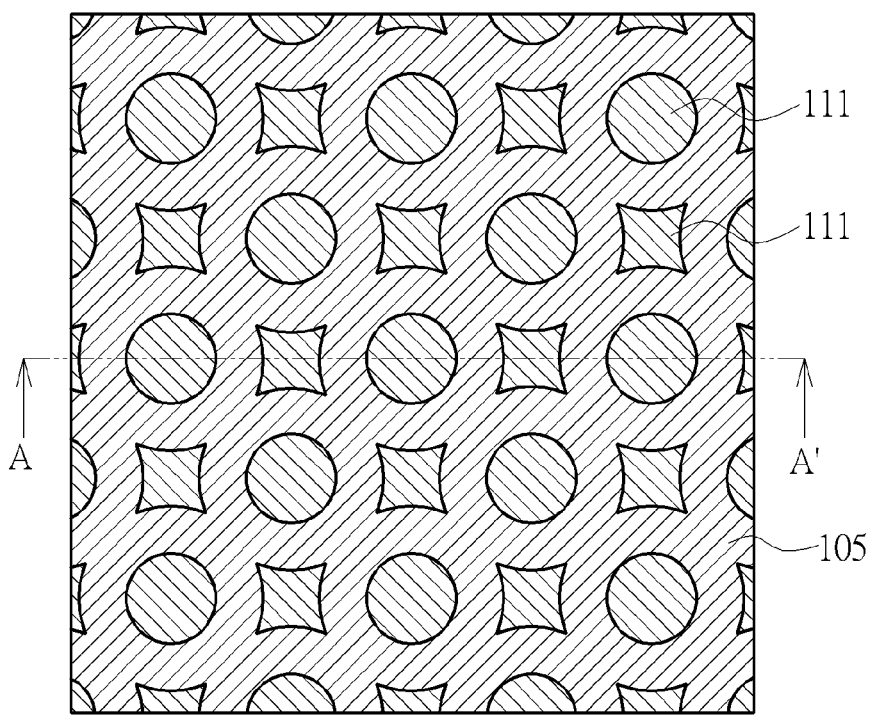

Refer now to FIGS. 5A and 5B. After the patterns of the first concave portions 107 and the second concave portions 109 are formed and defined, a process is formed to fill up the first concave portions 107 and the second concave portions 109 surrounded by the spacer layer 105 with a directed self-assembly material. Directed self-assembly (DSA) material is a material containing block copolymers (BCPs, and possibly other additives) in predetermined formulation. The directed self-assembly mechanism can occur spontaneously or be induced, e.g., as a result of an annealing or baking process, depending upon the surface chemistry of the prepattern and the composition of the block copolymer used. In the exemplary embodiment, the directed self-assembly material 111 are di-block copolymer which may occur in a directed self-assembly mechanism under induced condition. A detailed actual example is provided below:

A layer of block copolymer, such as polystyrene (PS), poly-methylmethacrylate (PS-b-PMMA, 96 kg/mol-35 kg/mol, from polymer source), was spun-cast onto the substrate and filled into the first concave portions 107 and the second concave portions 109 defined and surrounded by the spacer layer 105. Under right activating conditions, the blocks of such di-block copolymers phase separate into microdomains (also known as "microphase-separated domains" or "domains") to reduce the total free energy. Therefore, in the DSA process, the directed self-assembly material 111 filling up the first concave portions 107 and the second concave portions 109 would diffuse to the boundaries of the first concave portions 107 and the second concave portions 109 to form an uniform hole surrounding by the directed self-assembly material 111 in each of the first concave portions and the second concave portions.

In the present invention, the first directed self-assembly material and second directed self-assembly material might generally comprises any appropriate microdomain-forming block (copolymer) to which another, dissimilar block can be attached. Blocks can be derived from different polymerizable monomers, where the blocks might include but are not limited to: polyolefins including polydienes, polyethers including poly(alkylene oxides) (such as poly(ethylene oxide), poly(propylene oxide), poly(butylene oxide), or random or block copolymers of these), poly((meth)acrylates), polystyrenes, polyesters, polyorganosiloxanes, polyorganogermanes, and the like.

Figure 6A:
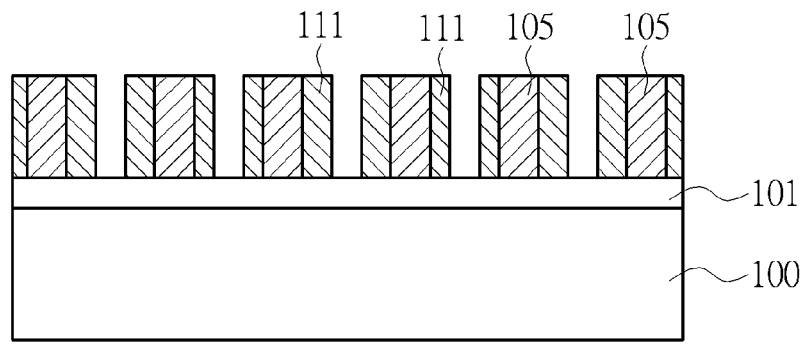
Figure 6B:
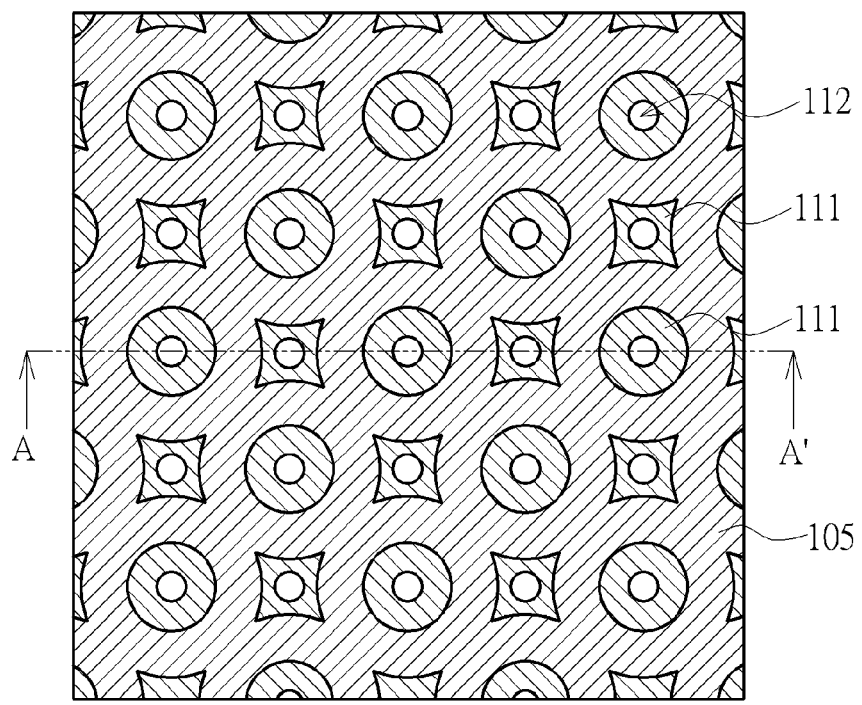

According to the explanation above, please refer now to FIGS. 6A and 6B, the target patterns, i.e. the hole 112 formed by the diffusion of the directed self-assembly material 111 in DSA process, are evenly distributed on the hard mask layer 101 and surrounded by the directed self-assembly material 111 in each first concave portions 107 and second concave portion 109. The directed self-assembly material 111 diffusing toward the boundary would expose the hard mask layer 101 thereunder after the DSA process. It can be noticed that, since the hole 112 is formed by the diffusion of the directed self-assembly material 111 in each concave portion, the CD of hole pattern in the array is reduced and further smaller than the original width of the concave portion. In comparison to the array of hole pattern formed by conventional double patterning scheme, the final target hole pattern formed by the method of the present invention has uniform shape and better CD uniformity, and most importantly, smaller feature size.

Figure 7:
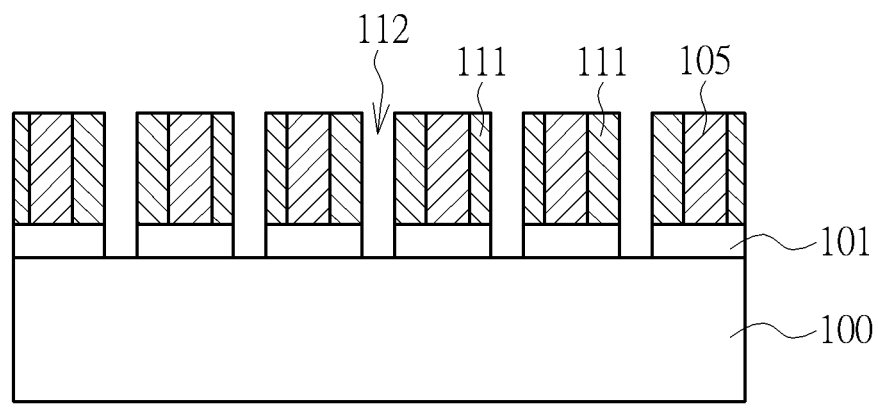
Figure 8:
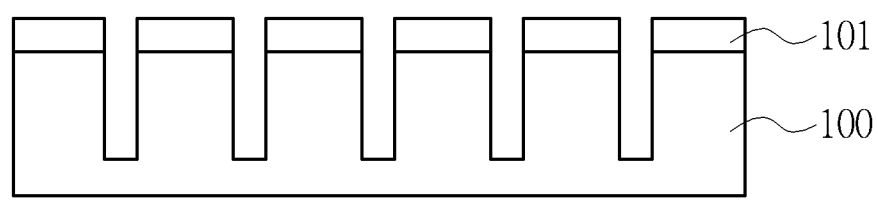

Please refer now to FIGS. 7 and 8. After the DSA process and uniformed hole pattern is defined, other processes for forming contact or via structure may be performed. In FIG. 7, the remaining spacer layer 105 and the directed self-assembly material 111 are used as an etch mask to transfer the hole pattern to the substrate 100. In the condition that the substrate 100 is provided with the hard mask layer 101, the uniformly-distributed hole pattern 113 may be first transferred to the hard mask layer 101 by an etch process using the remaining spacer layer 105 and the directed self-assembly material 111 are used as an etch mask. In FIG. 8, the patterned hard mask layer 101 serves as the true etch mask to etch the substrate 100 and forms the array of contact holes or vias with uniform CDs and distribution. An additional backfilled process with conductive metallic materials may be performed to fill up the holes and forms the contact or via structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a pattern, comprising:
    forming an array of circular pillars on a substrate, wherein the circular pillars are arranged in a staggered manner;
    conformally forming a spacer layer on the circular pillars and the substrate to form a plurality of first concave portions surrounded by the spacer layer;
    etching the spacer layer to form an annular spacer surrounding each of the circular pillars and expose the circular pillars;
    removing the circular pillars to form a plurality of second concave portions surrounded by the annular spacer;
    filling up the first concave portions and the second concave portions with a directed self-assembly material; and
    activating a directed self-assembly process so that the directed self-assembly material filling up the first concave portions and the second concave portions diffuse to the boundaries of the first concave portions and the second concave portions to form a hole surrounding by the directed self-assembly material in each of the first concave portions and the second concave portions.

2. The method for forming a pattern of claim 1, further comprising:
    using the annular spacer and the remaining directed self-assembly material as an etch mask to etch the substrate, thereby transferring the pattern of the holes to the substrate.

3. The method for forming a pattern of claim 2, wherein the substrate further comprises a topmost hard mask layer, and the pattern of the holes is transferred to the topmost hard mask layer to form a patterned hard mask layer.

4. The method for forming a pattern of claim 3, further comprising using the patterned hard mask layer as an etch mask to etch the substrate.

5. The method for forming a pattern of claim 1, wherein the first concave portions are evenly distributed in the array with the circular pillars and surrounded by the spacer layer, and wherein each of the first concave portions is surrounded by four of the circular pillars.

6. The method for forming a pattern of claim 1, wherein the second concave portions are evenly distributed on the substrate and surrounded by the annular spacer, and wherein each of the first concave portions is surrounded by four of the second concave portions.

7. The method for forming a pattern of claim 1, wherein the pattern of the holes is an array of contact holes.

8. The method for forming a pattern of claim 7, wherein the pattern of the holes comprises identical shape and size of the contact holes after the directed self-assembly process.

9. The method for forming a pattern of claim 1, wherein the spacer layer is formed by an atomic layer deposition process.

10. The method for forming a pattern of claim 1, wherein the directed self-assembly process comprises a baking process or an annealing process.

11. The method for forming a pattern of claim 1, wherein the directed self-assembly material comprises polystyrene, polymethylmethacrylate, polydienes, poly(ethylene oxide), poly(propylene oxide), poly(butylene oxide), poly((meth)acrylates), polyesters, poly-organosiloxanes, or polyorganogermanes.

* * * * *